United States Patent [19]

Buchwalter

[11] Patent Number: 4,832,808
[45] Date of Patent: May 23, 1989

[54] POLYIMIDES REACTION PRODUCTS AND USE IN ELECTROPHORETIC DEPOSITION

[75] Inventor: Stephen L. Buchwalter, Wappingers Falls, N.Y.

[73] Assignee: International Business Machines Corporation, Armonk, N.Y.

[21] Appl. No.: 278

[22] Filed: Jan. 2, 1987

[51] Int. Cl.$^4$ .............................................. G01N 13/06
[52] U.S. Cl. .................. 204/181.7; 524/600; 524/591; 525/421; 525/422; 525/436
[58] Field of Search ............... 204/181.7, 181.6, 181.4; 524/600, 591; 525/421, 422, 436

[56] References Cited

U.S. PATENT DOCUMENTS

| | | | |
|---|---|---|---|
| 3,846,260 | 11/1974 | Martello et al. | 204/181 |
| 3,936,404 | 2/1976 | Ishizuka et al. | 204/181.7 |
| 3,998,904 | 12/1976 | Balme et al. | 525/422 |
| 4,012,361 | 3/1977 | Bargain | 525/436 |
| 4,046,658 | 9/1977 | Brown | 204/181.7 |
| 4,053,444 | 10/1977 | Phillips | 260/30.2 |
| 4,252,707 | 2/1981 | Ruid | 525/436 |
| 4,259,221 | 3/1981 | Pauze | 525/436 |
| 4,334,973 | 6/1982 | Carlson et al. | 204/181 R |
| 4,384,946 | 5/1983 | Patzschke et al. | 204/181 C |
| 4,425,467 | 1/1984 | Alvino et al. | 524/600 |
| 4,433,131 | 2/1984 | Bolon | 428/375 |
| 4,474,658 | 10/1984 | Alvino et al. | 204/181 C |
| 4,526,838 | 7/1985 | Fujioka | 524/600 |
| 4,533,448 | 8/1985 | Scala et al. | 204/181.7 |
| 4,563,515 | 1/1986 | Schipfer et al. | 528/111 |
| 4,576,980 | 3/1986 | Dai | 204/181.7 |
| 4,596,844 | 6/1986 | Ohsawa et al. | 204/181.7 |

Primary Examiner—John F. Niebling
Assistant Examiner—Ben C. Hsing
Attorney, Agent, or Firm—Pollock, Vande Sande & Priddy

[57] ABSTRACT

Reaction product of a polyimide and a secondary/tertiary polyamine and/or primary/tertiary polyamine, and/or protected primary/tertiary polyamine, and use thereof in electrophoretic deposition.

23 Claims, No Drawings

POLYIMIDES REACTION PRODUCTS AND USE IN ELECTROPHORETIC DEPOSITION

DESCRIPTION

1. Technical Field

The present invention is concerned with novel polyimide reaction products. In particular, the polyimide reaction products of the present invention are especially suitable for providing films on a substrate by electrophoretic deposition. The present invention is especially valuable in fabrication of microelectronic devices and packaging.

2. Background Art

Polyimides are of particular value in the fabrication of microelectronic devices and packaging because of their excellent combination of thermal and electrical properties. Polyimides are useful for providing insulating coatings on electrical circuits and electrical devices. Films of polyimides are conventionally applied by spinning of the polyimide or its precursor in an organic solvent, or by lamination of preformed polyimide films. However, electro-coating or electrophoretic deposition to provide a polyimide coating has not been practiced to any great extent commercially.

Electrophoretic deposition involves applying a direct current potential across a liquid medium containing charged particles. The particles migrate towards the electrode bearing the opposite charge and deposit thereon. Although electrophoretic deposition has been utilized to apply a number of different types of polymers to conductive surfaces such as for electrical insulation, paint priming, and other purposes, the commercial exploitation of such process to provide polyimide layers has not been achieved.

In fact, there have been suggestions of electrophoretic deposition techniques for modified polyimides, but such suggested methods suffer from one or more deficiencies that have prevented use from an industrial or commercial viewpoint. Examples of some suggestions concerning electrophoretic deposition of polyimide compositions include U.S. Pat. Nos. 3,846,269, 4,053,444, 4,334,973, 4,384,946, 4,425,467, 4,474,658, and 4,533,448. In addition, of general interest is U.S. Pat. No. 4,563,515 which is concerned with reaction products of an epoxy resin and various amines.

The suggestions for the electrophoretic deposition to provide polyimide coatings are, for the most part, concerned with processes whereby the deposition is on the anode. This, however, is unsatisfactory since oxidation or corrosion of the metals also occurs at the anode, thereby contributing to unacceptable degradation of the insulating properties of anodically deposited films due to the incorporation of metal ions therein. This is particularly undesirable for electronic applications. Those electrophoretic processes that suggest using polyamic acid precursors to the polyimides are undesirable since there is no control over the number of ionizable groups on the polymer.

SUMMARY OF INVENTION

The present invention overcomes the above-discussed deficiencies in the prior art suggestions. For instance, the present invention provides for the ability to deposit the polyimide coating on the substrate acting as the cathode, thereby eliminating the problems with respect to oxidation or corrosion that occur at the anode. In addition, the present invention provides for control of the concentration of the ionic groups present to facilitate the electrophoretic deposition process. In turn, the control of the concentration of the ionic groups makes it possible to optimize the emulsion and coalescence properties involved.

In particular, the present invention is concerned with a reaction product of an organic soluble polyimide and a polyamine. The polyamine employed must be a secondary/tertiary polyamine and/or a primary/tertiary polyamine and/or a protected primary/secondary polyamine. It is necessary in carrying out the present invention that the polyamine employed contains only one secondary amino group or only one primary group available for reaction. This is essential to prevent cross-linking of the polyimide which would be detrimental in carrying out the present invention.

In addition, the present invention is concerned with a reaction product of an organic soluble polyimide, the polyamines of the type discussed above, and an acid in order to provide ionic groups on the polymer.

The present invention is also concerned with an aqueous emulsion containing the reaction product of the organic soluble polyimide, polyamine, and acid.

Furthermore, the present invention is concerned with a method of coating a substrate by electrophoretically depositing a polymer onto a substrate from a composition that contains the reaction product of the organic soluble polyimide, polyamine, and acid.

BEST AND VARIOUS MODES FOR CARRYING OUT THE INVENTION

The polyimides that can be employed in obtaining the reaction products of the present invention include unmodified polyimides, as well as modified polyimides such as polyester-imides, polyamide-imide-esters, polyamide-imides, polysiloxane-imides, as well as other mixed polyimides. Such are well-known in the prior art and need not be described in any great detail. However, it is essential to the present invention that the preformed polyimides employed pursuant to the present invention be soluble in organic solvents. Some examples of commercially available organic soluble polyimides are those available from National Starch and Chemical Company under the trade designation Thermid, such as Thermid IP-615, Thermid MC600, Thermid IP-600, and Thermid IP-630; Matrimid 5218 from Ciba-Geigy Corporation; PI-2080 from Upjohn; and the polyimide and siloxane-/polyimide polymers available from M & T Chemicals under the trade designations 2065, 3500, and 5000.

Generally, the polyimides include the following recurring unit:

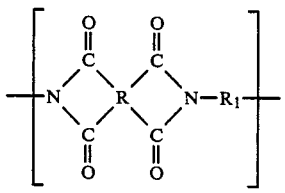

where n is an integer representing the number of repeating units to provide a molecular weight usually about 10,000 to about 100,000. R is at least one tetravalent organic radical selected from the group consisting of:

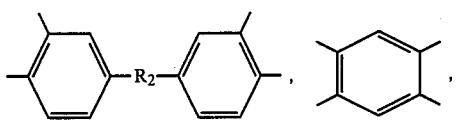, 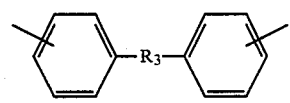

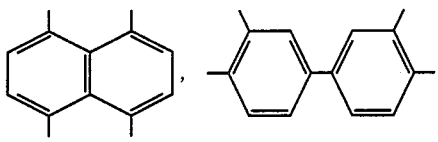

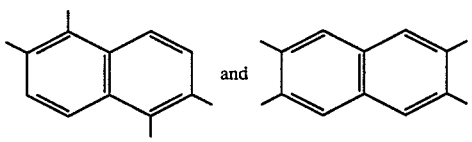 and 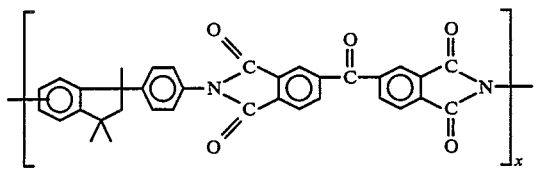

in which $R_3$ is a divalent organic radical selected from the group consisting of $R_2$, silico, and amino radicals. Polymers containing two or more of the R and/or $R_1$ radicals, especially multiple series of $R_1$ containing amido radicals, are particularly valuable in some instances.

Typical structural formulas for some of the above-mentioned commercially available polyimides are as follows:

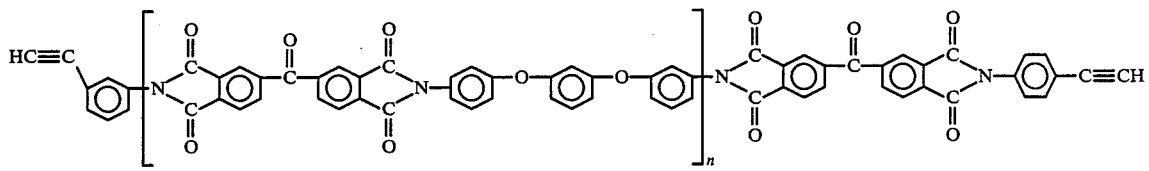
MATRIMID 5218

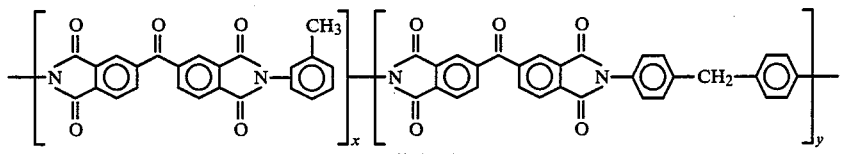
THERMID MC600

(structure)
UPJOHN PI2080

$R_2$ being selected from the group consisting of divalent aliphatic hydrocarbon radicals having from 1 to 4 carbon atoms and carbonyl, oxy, sulfo, and sulfonyl radicals and in which $R_1$ is at least one divalent radical selected from the group consisting of:

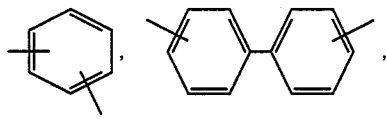

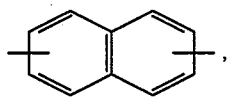

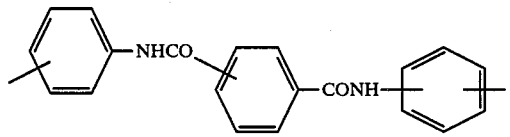

In accordance with the present invention, the polyimide is dissolved in an organic solvent to facilitate the reaction with the secondary/tertiary polyamine and/or primary/tertiary polyamine and/or protected primary/secondary polyamine. Such solvents include N-methylpyrrolidone, N,N-dimethylacetamide, and acetophenone.

The polyimide is modified by reaction with a secondary/tertiary polyamine and/or primary/tertiary polyamine and/or protected primary/secondary polyamine and, preferably, a secondary/tertiary polyamine. It is essential, in accordance with the present invention, that the polyamine employed contains only one reactive primary or secondary amino group that is available to react with the polyimide. Otherwise, the polyamine would result in cross-linking of the polyimide, thereby defeating the purposes of the present invention. The polyamine employed can be a diamine or higher amine. Examples of secondary/tertiary polyamines employed in accordance with the present invention include 1-methylpiperazine, 1,-(N,N-dimethylamino)-3-(n'- methylamino) propane (N,N,N'-trimethyl-ethylenediamine), 2-(dimethylamino) morpholine, 3-(dimethylamino) piperidine; 1-methyl-4-(2-methylaminoethyl) piperazine and bis-2-dimethylaminoethyl) (N,N,N',N'-tetramethyldiethylenetriamine). Examples of primary/tertiary polyamines are N,N-dimethylethylenediamine and 3-dimethylaminopropylamine.

Protected primary/secondary polyamines refer to polyamines containing one reactive secondary amine group and one or more primary amine groups whereby the primary amine groups are protected or blocked from reacting by having been reacted with a compound such as a ketone to form a ketimine. The formation of the ketimine prevents reaction of the primary amine groups in absence of water. An example of a protected primary/secondary polyamine is diethylenetriamine diketimine which is the reaction product of methyl isobutyl ketone and diethylenetriamine. The preferred amine is 1-methylpiperazine.

The amount of amine employed is generally in an amount sufficient to react with at least about 10% of the imide groups of the polyimide and, preferably, at least about 25%. The amount of amine employed can be such as to provide reaction with all of the imide groups present in the polyimide. The reaction of the amine with the polyimide is generally carried out from room temperature to about 120° C. and, preferably, at about 80° C. to about 120° C. The reaction is usually completed within about 2 hours.

In order to provide ionic groups on the polymer so that such can be employed in an electrophoretic process, the reaction product of the polyimide and amine is then treated with an acid so as to convert the amine groups to ionic groups. Suitable acids include the carboxylic organic acids and, especially, acetic acid, oxalic acid, lactic acid, and chloroacetic acid. The preferred acid is lactic acid. The amount of acid employed is usually such as to provide an acid to amine equivalent ratio of about 0.3 to about 1.1 and preferably about 0.9.

The amine-modified polyimide solution containing the acid is then stirred rapidly during the relatively slow addition of water thereto in order to obtain a fine, stable, aqueous emulsion of the modified polyimide. Prior to the addition of the water, the reaction product of the polyamine and polyimide is dissolved in organic solvents. Preferably, at least one of the solvents should have limited solubility in water. Examples of such solvents include acetophenone, 2-phenoxyethanol, cyclohexanone, acetate esters such as ethyl acetate, and methyl isobutyl ketone.

The relative amount of organic solvent to the modified polyimide is about 50% to about 250% and, preferably, about 100% to about 200%. The aqueous emulsion generally contains about 1% to about 10% by weight of the amine-modified polyimide and about 99% to about 90% by weight of water.

The emulsion is relatively stable and shows no signs of precipitation even after being maintained at about room temperature with stirring for more than 2 days.

The emulsions prepared in accordance with the present invention can be, and are preferably, used for electrophoretic deposition. In particular, the deposition is on the cathode and involves providing an anode such as a carbon rod and a metallic substrate that is to be coated, such as a substrate of a metal such as aluminum, copper, or stainless steel and providing such in a container containing the above emulsion. The anode and cathode are connected to a DC power source that provides a constant voltage of about 10 volts to about 400 volts, preferably about 50 volts to about 400 volts, and most preferably about 50 volts to about 100 volts. The coating is generally completed in about 1 minute to about 5 minutes and provides a coating thickness of about 5 microns to about 30 microns, and preferably about 10 microns to about 30 microns.

After the coated substrate is removed from the emulsion and rinsed with water, the modified polyimide is subjected to a post-baking in order to remove the remaining water and other organic volatiles in the composition and in order to enhance the coalescence and flow of the film. In addition, the post-baking serves to remove the modification of the polyamine used to form the ionic groups in the polyimide. Accordingly, the polyimide, after the post-baking, will have little, if any, residual polyamine or acid present. This is desirable to preclude degradation of the thermal and/or electrical properties of the polyimide film. However, minor amounts, such as up to about 10% of the polyamine can remain in the film.

In preferred aspects of the present invention, the film is heated in a staged heating procedure. For instance, the film is initially heated to about 35° C. in a saturated atmosphere of acetophenone for about 30 minutes, then heated up to about 100° C. in air and maintained there for about 3 hours, and then to about 250° C. under vacuum for about 4 hours to remove any traces of volatile solvent, and finally, up to about 350° C. under vacuum for about 1 hour in order to assure elimination of the polyamine from the film. Generally, at least about 90% of the amount of polyamine employed is removed from the film.

The preferred heating procedure is employed since, if the film is heated rapidly to the higher temperature of about 350° C., escaping volatiles from the film tend to cause defects in the film.

The following reaction scheme is presented to facilitate understanding of the reaction sequence involved. For the sake of simplicity, the amine is represented by 1-methylpiperazine and the organic acid by acetic acid.

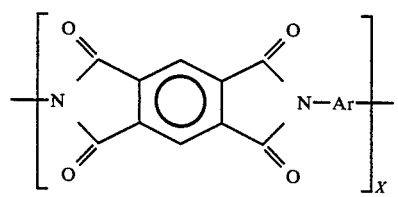

-continued

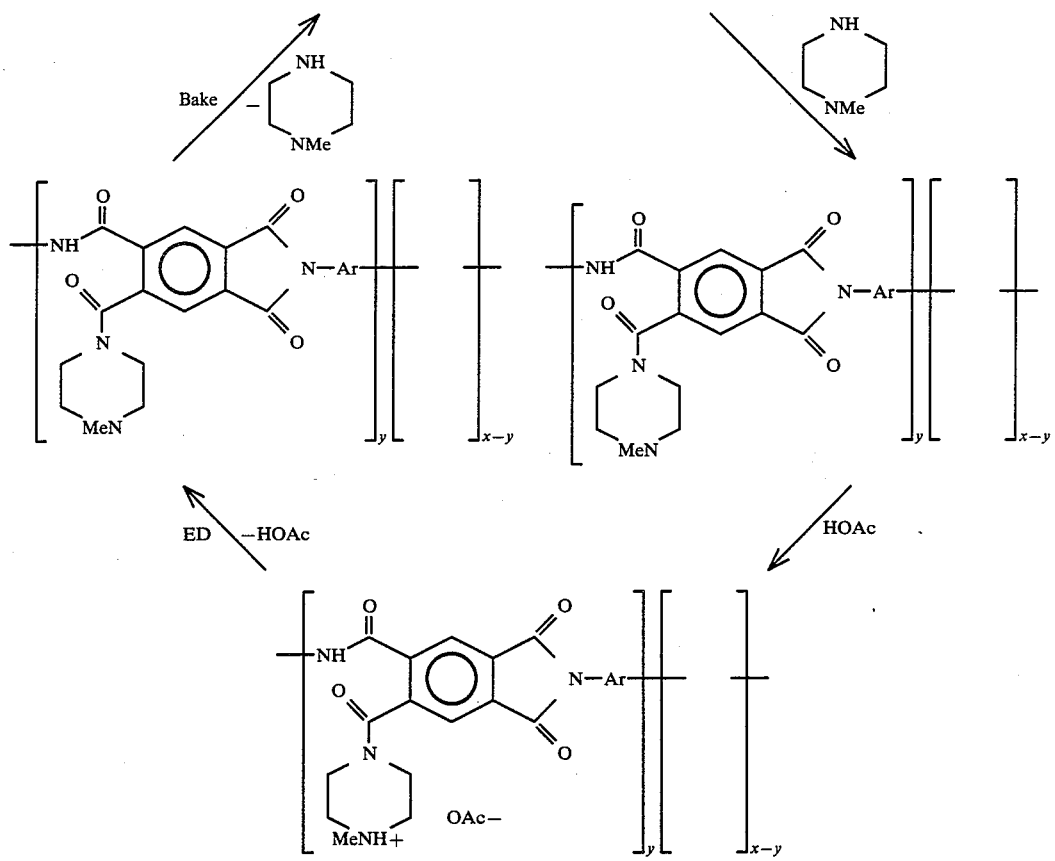

The following non-limiting examples are presented to further illustrate the present invention.

EXAMPLE 1

About 100 grams of Ciba-Geigy Matrimid 5218 and about 200 grams of 1-methylpyrrolidinone are charged to a 500 ml reaction flask. The polymer is dissolved by stirring the mixture while warming to approximately 90° C. A blanket of nitrogen is kept over the mixture. Once the polymer is completely dissolved (approximately 30 minutes), the addition of a mixture of about 12.04 g of 1-methylpiperazine and 100 g of acetophenone is begun. The addition is continued over about 90 minutes with vigorous stirring throughout. The temperature is kept at 80°–95° C. during the addition. After the addition is complete, the mixture is stirred and warmed to 110° C. and held at that temperature for about 2 hours. The resultant modified polymer solution is then used to prepare the electrophoretic deposition emulsion as detailed below.

To about 88.3 g of the modified polymer solution is added about 18.5 g of acetophenone and about 4.9 g of 50% aqueous lactic acid. The mixture is stirred vigorously in a 500 ml stainless steel beaker while about 488 ml of deionized water are added slowly. The stirred mixture becomes quite viscous as the gradual water addition continues, then thins out as the addition of water is completed.

The translucent brown emulsion is placed in a constant temperature bath at 25° C., with stirring provided by a Teflon stirbar and a submersible magnetic stirrer. Aluminum test pieces (100 mm×45 mm, with a number of holes of various sizes) are placed into the emulsion along with a 9 mm diameter graphite rod. The latter is wrapped with Teflon tape to reduce its surface area. The exposed area of the rod is approximately 1/50th of the area of the aluminum test piece. The distance between the rod and the test piece is about 60 mm. The rod and test piece are connected to a DC power supply as the anode and cathode, respectively. The voltage is turned up to 85 volts within 15 seconds and held there for 2 minutes. The test piece is removed, rinsed rapidly in deionized water, and placed in a warm (40° C.) dry chamber containing some acetophenone to impede the evaporation of the same from the drying film. After 25 minutes, the test piece is removed from the chamber. Inspection shows a uniform, smooth coating still tacky with acetophenone.

The coating is baked in three steps. First, it is heated in a convection oven at 100° C. for six hours. The test piece is then transferred to a vacuum oven and heated under vacuum (about 10 torr) as follows: 250° C. for 4 hours, ramped to 350° C. over 3 hours, and heated at 350° C. for 45 minutes. The resultant smooth, dark brown coating has a thickness of 17 microns which is uniform over the whole surface of the substrate.

EXAMPLE 2

About 10 grams of National Starch and Chemical Co. Thermid IP615 is stirred into about 25 grams of N-methylpyrrolidone at room temperature. After about one hour, approximately 1.8 grams of 1-methylpiperazine is added. The mixture is observed to warm slightly. After another hour of stirring, the mixture is left at room temperature for a few days.

About 16 grams of the above mixture are mixed with about 0.9 grams of glacial acetic acid. Water is added slowly with rapid stirring. After a total of 250 ml of deionized water has been added, a milky, pink eemulsion is obtained. To this emulsion about 5.1 grams of 2-phenoxyethanol is added with stirring. Using an experimental set-up similar to that described in Example 1, an aluminum test panel is coated at about 75 volts for about one minute. After removal from the emulsion and rinsing with water, the panel is observed to have a continuous adherent coating.

EXAMPLE 3

Ciba-Geigy Matrimid 5218, about 20 grams, is dissolved in about 65 grams of cyclohexanone by heating to about 100° C. with stirring over about an hour. Approximately 3.6 grams of N-methylpiperazine is added, and the mixture is stirred at about 100° C. for an hour.

About 47 grams of the above modified polymer solution is stirred in a stainless steel beaker with about 25 grams more cyclohexanone. Glacial acetic acid, about 1.1 grams, is stirred in before about 240 ml of deionized water is added slowly with rapid stirring. The resultant emulsion is used to coat test panels as in Example 1, using 50–75 volts for about one minute. After removal from the emulsion and rinsing with water, the panel is observed to have a continuous adherent coating.

EXAMPLE 4

About 25 grams of Matrimid 5218 is dissolved in about 50 grams of N-methylpyrrolidone by stirring under nitrogen and warming to about 90° C. About 1.5 grams of 1-methylpiperazine is added, and the mixture is stirred and heated for an hour at 100° C. The modified polymer solution is then diluted with about 25 grams of cyclohexanone and allowed to cool to room temperature.

The above modified polymer solution is used to prepare an emulsion for electrophoretic deposition. About 48 grams of the solution are mixed with about 21 grams of 2-phenoxyethanol in a stainless steel beaker. The mixture is then treated with about 1.2 grams of glacial acetic acid before being diluted with about 200 ml of deionized water with rapid stirring. The resultant translucent yellow-green emulsion is used to coat test panels as in Example 1, using 50–150 volts for about 90 seconds. After removal from the emulsion and rinsing with water, the panel is observed to have a uniform, smooth coating.

Having thus described my invention, what I claim as new and desire to secure by Letters Patent is:

1. Reaction product of an organic, soluble polyimide polymer and a polyamine selected from the group consisting of secondary/tertiary polyamines, protected primary/secondary polyamines, and mixtures thereof to form diamide groups wherein said polyamine contains only one available reactive secondary amino group.

2. The reaction product of claim 1 wherein said polyamine is a secondary/tertiary polyamine.

3. The reaction product of claim 1 wherein said polyamine is a secondary/tertiary diamine.

4. The reaction product of claim 1 wherein said polyamine is 1-methylpiperazine.

5. The reaction product of claim 1 wherein the said polyamine is employed in an amount sufficient to react with at least about 10% of the imide groups of said polyimide polymer.

6. The reaction product of claim 1 wherein the said polyamine is employed in an amount sufficient to react with at least about 25% of the imide groups of said polyimide polymer.

7. Reaction product of an organic, soluble polyimide polymer and a polyamine selected from the group consisting of secondary/tertiary polyamines, protected primary/secondary polyamines and mixtures thereof to form diamide groups wherein said polyamine contains only one available reactive secondary amino group and an acid.

8. The reaction product of claim 7 wherein said acid is an organic carboxylic acid.

9. The reaction product of claim 7 wherein said acid is selected from the group consisting of acetic acid, oxalic acid, lactic acid, chloroacetic acid, and mixtures thereof.

10. The reaction product of claim 7 wherein said acid includes acetic acid.

11. The reaction product of claim 7 wherein said acid includes lactic acid.

12. The reaction product of claim 7 wherein the acid is employed in an amount to provide an acid to amine equivalent of about 0.9 to 1.1.

13. The reaction product of claim 7 wherein said polyamine is a secondary/tertiary polyamine.

14. The reaction production of claim 7 wherein said polyamine is a secondary/tertiary diamine.

15. The reaction product of claim 7 wherein said polyamine is 1-methylpiperazine.

16. The reaction product of claim 7 wherein the said polyamine is employed in an amount sufficient to react with at least about 10% of the imide groups of said polyimide polymer.

17. The reaction product of claim 7 wherein the said polyamine is employed in an amount sufficient to react with at least about 25% of the imide groups of said polyimide polymer.

18. An aqueous emulsion containing the reaction product of claim 7.

19. The emulsion of claim 18 that contains about 1% to about 10% by weight of said reaction product.

20. A method of coating a substrate comprising electrophoretically depositing a polyimide polymer onto a conductive substrate from composition containing the reaction product of an organic, soluble polyimide polymer and a polyamine selected from a the group consisting of secondary/tertiary polyamines, protected primary/secondary polyamines, and mixtures thereof to form diamide groups wherein said polyamine contains only one available reactive secondary amino group and an acid.

21. The method of claim 20 wherein said composition is an aqueous emulsion.

22. The method of claim 21 wherein said polyimide polymer is deposited onto a cathode.

23. The method of claim 20 which further includes post-baking after the depositing to remove at least about 90% of the polyamine from the polyimide polymer.

* * * * *